United States Patent [19]
Sumitani

[11] Patent Number: 6,028,334
[45] Date of Patent: Feb. 22, 2000

[54] SEMICONDUCTOR DEVICE AND METHOD OF MANUFACTURING THE SAME

[75] Inventor: Hidetoshi Sumitani, Tokyo, Japan

[73] Assignee: NEC Corporation, Tokyo, Japan

[21] Appl. No.: 08/758,258

[22] Filed: Nov. 27, 1996

[30] Foreign Application Priority Data

Dec. 18, 1995 [JP] Japan ................................. 7-329305

[51] Int. Cl.[7] ................................................. H01L 27/108
[52] U.S. Cl. ........................ 257/306; 257/308; 257/309
[58] Field of Search .................................. 257/300–309, 257/310, 311; 438/253, 254, 255, 256; 361/301.4, 303, 329

[56] References Cited

U.S. PATENT DOCUMENTS

| 5,338,955 | 8/1994 | Tamura et al. | 257/307 |
|---|---|---|---|
| 5,441,909 | 8/1995 | Kim | 437/52 |
| 5,443,993 | 8/1995 | Park et al. | 437/60 |
| 5,449,636 | 9/1995 | Park et al. | 437/60 |
| 5,656,852 | 8/1997 | Nishioka et al. | 257/632 |

FOREIGN PATENT DOCUMENTS

| 6248062 | 3/1987 | Japan . |
|---|---|---|
| 4332161 | 11/1992 | Japan . |
| 6-151748 | 5/1994 | Japan . |

*Primary Examiner*—Sara Crane
*Attorney, Agent, or Firm*—Whitham, Curtis & Whitham

[57] ABSTRACT

A semiconductor device in which at least one lower electrode is formed on an insulating film formed on a semiconductor substrate, and a capacitive insulating film and an upper electrode are formed on a surface of said lower electrode, thereby forming a capacitive element, wherein said lower electrode has side walls each formed integrally on a side surface thereof and consisting of a conductive film whose lower end portion extends from a bottom surface of said lower electrode to a semiconductor substrate side.

7 Claims, 10 Drawing Sheets

FIG. 1
PRIOR ART
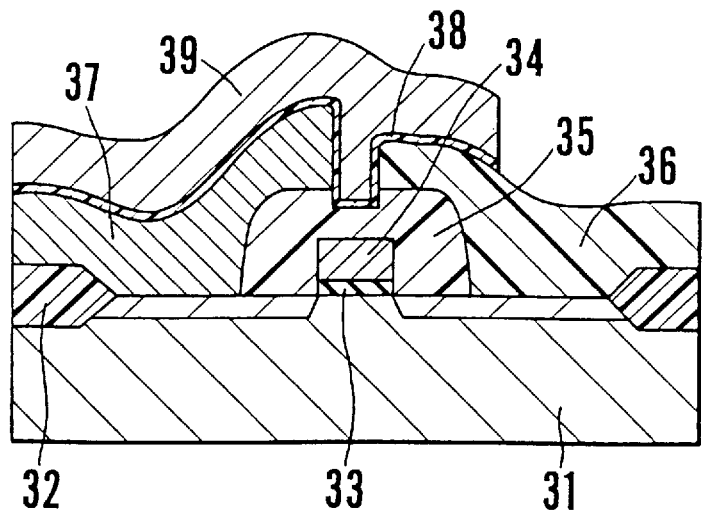
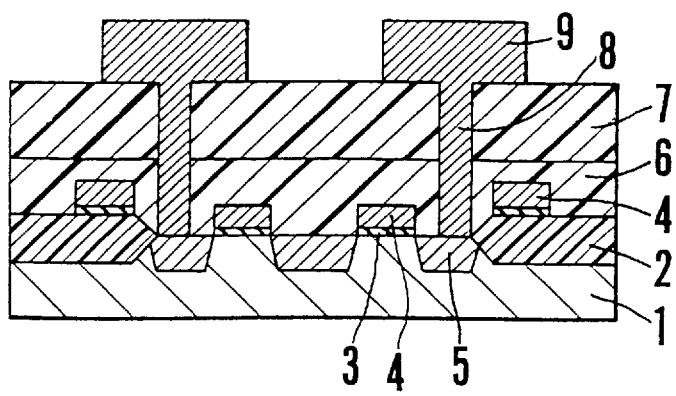
FIG. 2A
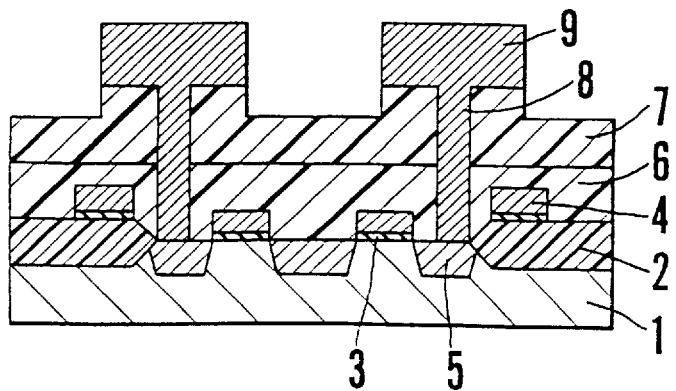
FIG. 2B

SEMICONDUCTOR DEVICE AND METHOD OF MANUFACTURING THE SAME

BACKGROUND OF THE INVENTION

1. Field of the Invention

The present invention relates to a semiconductor device having a capacitive element such as a DRAM and a method of manufacturing the same.

2. Description of the Prior Art

Along with increases in capacitances of semiconductor memories in recent years, the memory cell area continues to shrink. Under the circumstances, structures for increasing the charge storage amounts of capacitive elements without increasing their planar layout areas have been proposed. A stacked type capacitive element is one of such devices, and is constituted by a lower electrode formed on a semiconductor substrate, a capacitive insulating film formed on the surface of the lower electrode, and an upper electrode so formed as to cover the lower electrode via the capacitive insulating film. In this capacitive element, however, the opposite area of the lower and upper electrodes is determined on the basis of the upper and side surface areas of the lower electrode. Therefore, to increase the capacitance without increasing the upper surface area, the lower electrode must be made thick.

A technique based on such a technical concept is disclosed in Japanese Unexamined Patent Publication No. 4-332161. FIG. 1 is a schematic sectional view showing this technique. An element isolation insulating film 32, a gate insulating film 33, and a gate electrode 34 are formed on a semiconductor substrate 31. After the gate electrode 34 is covered with a first insulating film 35, a second insulating film 36 formed on the resultant structure is selectively etched to form an opening. When a lower electrode 37 is deposited on a region including this opening, the lower electrode 37 portion at the opening end portion of the second insulating film 36 is made thicker than the remaining portion. The lower electrode 37 is etched at its thick portion to expose a side surface corresponding to the thickness of that portion. A capacitive insulating film 38 and an upper electrode 39 are formed on this side surface to oppose each other, thereby completing a capacitive element. With this structure, the charge storage amount is increased.

In the technique described in this prior art, however, the lower electrode 37 itself is made thick, resulting in a difficulty in fine etching process. In addition, when the lower electrode 37 is to be etched, the etching end portion must be aligned with respect to the opening end portion of the second insulating film 36, and this aligning operation is difficult. If a degradation in process accuracy, or a misalignment occurs, the side surface area of the lower electrode 37 tends to vary, and the designed capacitance value can hardly be obtained. The lower electrode 37 tends to sharply project upward near the etching end portion. This projecting portion may be easily damaged in a later process. In addition, the steep step makes it difficult to obtain a capacitive insulating film 38 or an upper electrode 39 having a uniform thickness. Particularly, the capacitive insulating film 38 cannot be satisfactorily formed at the acute-angled portion, resulting in a decrease in dielectric strength or a short circuit between the upper and lower electrodes. Since the projecting portion degrades the surface planarity of the semiconductor device, disconnection in the upper interconnect tends to occur.

SUMMARY OF THE INVENTION

The present invention has been made in consideration of the above situation of the prior art, and has as its object to provide a semiconductor device capable of obtaining a large capacitance value relative to the planar layout area, and also a designed capacitance value while increasing the process accuracy, and at the same time, realizing a high surface planarity, and a method of manufacturing the same.

In order to achieve the above object, according to the first aspect of the present invention, there is provided a semiconductor device in which at least one lower electrode is formed on an insulating film formed on a semiconductor substrate, and a capacitive insulating film and an upper electrode are formed on a surface of the lower electrode, thereby forming a capacitive element, wherein the lower electrode integrally has a side wall consisting of a conductive film whose lower end portion extends from a bottom surface of the lower electrode to a semiconductor substrate side.

A portion of the insulating film of the first aspect, which is not covered with the lower electrode, is etched such that a mesa is formed in which a portion covered with the electrode portion is higher than the portion which is not covered with the lower electrode, and the lower end portion of the side wall integrally formed on a side surface of the lower electrode extends to an etching region of the insulating film.

The insulating film is etched again to extend the etching region to an inside portion of the lower end portion of the polysilicon side wall.

In order to achieve the above object, according to the second aspect of the present invention, there is provided a method of manufacturing a semiconductor device, comprising the steps of forming at least one lower electrode on an insulating film formed on a semiconductor substrate, etching an insulating film portion except an insulating film portion covered with the lower electrode to form a mesa on a surface of the insulating film, depositing a conductive film to cover an entire surface, etching back the conductive film such that the conductive film remains on a side surface of the lower electrode and on a side surface of the mesa, to form a side wall, and sequentially forming a capacitive insulating film and an upper electrode on surfaces of the lower electrode and the side wall.

It is preferable to further include etching the insulating film again after the side wall according to the second aspect is formed, thereby extending an etching region to an inside of a lower end portion of the side wall.

In order to achieve the above object, according to the third aspect of the present invention, there is provided a method of manufacturing a semiconductor device, comprising the steps of forming a first conductive film on an insulating film formed on a semiconductor substrate, forming at least one lower electrode in a capacitive element formation region and at the same time etching the first conductive film such that the first conductive film remains even in a peripheral region, etching an insulating film portion except an insulating film portion covered with the lower electrode and the first conductive film to form a mesa on a surface of the insulating film, depositing a second conductive film to cover an entire surface, etching back the second conductive film such that the conductive film remains on a side surface of the lower electrode and on a side surface of the mesa, to form a side wall, sequentially forming a capacitive insulating film and an upper electrode on surfaces of the lower electrode and the side wall, and performing etching to remove the upper electrode, the capacitive insulating film, and the first conductive film from the peripheral region.

As is apparent from the respective aspects, in the semiconductor device of the present invention, the side wall having the lower end portion extending to the lower side of the bottom surface of the lower electrode, i.e., to the semiconductor substrate side is integrally formed on the lower electrode constituting the capacitive element. Therefore, the lower electrode can have a side surface area beyond its thickness without increasing the planar layout area, so that a large charge storage amount can be obtained. In addition, since the lower electrode has a uniform thickness, and no projecting portion is formed, the capacitive insulating film or upper electrode can be formed on the lower electrode with a uniform thickness. At the same time, structural stability can be warranted because of the side walls formed on both sides of the lower electrode, and the characteristics of the semiconductor device can also be stabilized.

In the manufacturing method of the present invention, the mesa portion is formed on the surface of the insulating film by etching the insulating layer under the lower electrode at a portion which is not covered with the lower electrode. The side wall consisting of a conductive film is formed on the flat side surfaces of the lower electrode and the mesa portion, and the capacitive insulating film and the upper electrode are sequentially formed on the surfaces of the lower electrode and the side wall, thereby forming a capacitive element. With this method, alignment is unnecessary, and the capacitive element can be formed with a smaller number of processes.

The above and many other advantages, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIG. 1 is a sectional view showing the structure of a conventional semiconductor device;

FIGS. 2A to 2G are sectional views showing steps in the manufacture of the first embodiment of the present invention;

DETAILED DESCRIPTION OF THE PREFERRED EMBODIMENTS

Figure 2C:
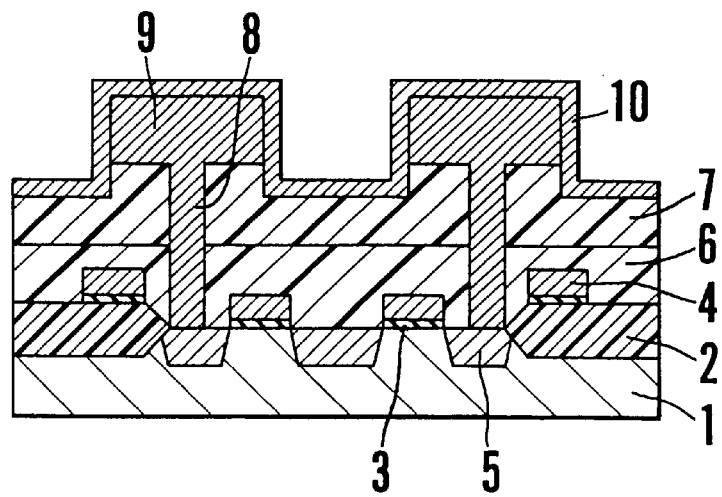

Preferred embodiments of the present invention will be described below with reference to the accompanying drawings. FIGS. 2A to 2G are sectional views showing steps of the first embodiment of the present invention. As shown in FIG. 2A, an element isolation region 2, a gate oxide film 3, and a polysilicon gate electrode 4 are formed on a p-type crystalline silicon substrate 1 by a known method. An $n^+$ diffusion region 5 is formed in the silicon substrate 1, thereby forming a MOS transistor. A first insulating interlayer 6 consisting of BPSG is formed on the resultant structure, and a second insulating interlayer 7 consisting of BPSG and having a thickness of 4,000 Å is formed on the first insulating interlayer 6. Openings for capacitive contacts 8 are formed in the first and second insulating interlayers 6 and 7 to reach the $n^+$ diffusion region 5. Impurity-doped polysilicon is deposited on the entire surface including the openings. This polysilicon film is selectively etched and patterned to form a lower electrode 9. The lower electrode 9 is formed to have a thickness of 4,000 Å.

Subsequently, as shown in FIG. 2B, the second insulating interlayer 7 is etched to about 3,000 Å by using the lower electrode 9 as a mask by known RIE, thereby forming a mesa between the insulating interlayer under the lower electrode 9 and the remaining insulating interlayer portion. Consequently, the lower electrode 9 portion becomes a mesa having a height of 7,000 Å, in which the upper side portion consists of the polysilicon film and the lower side portion consists of the second insulating interlayer 7. In the etching process for forming the mesa, the mask used to pattern the lower electrode 9 may be used without modification.

Figure 2D:
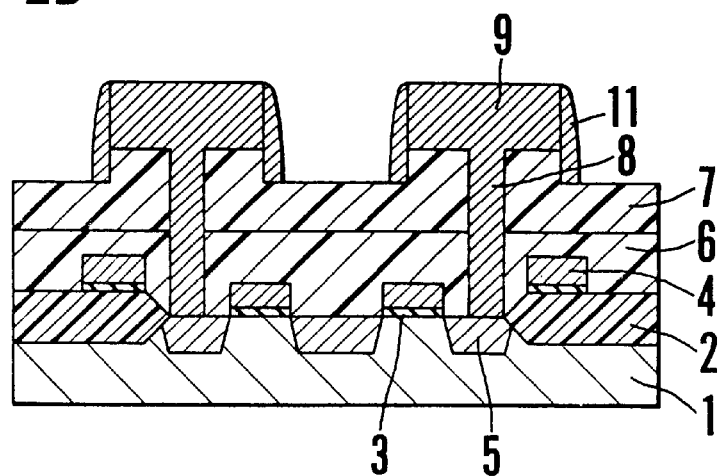

As shown in FIG. 2C, a doped polysilicon film 10 having a thickness of 1,000 Å is formed on the entire surface by CVD. As shown in FIG. 2D, the polysilicon film 10 is etched by anisotropic etching using RIE (reactive ion etching). With this process, the polysilicon film 10 between the mesas is removed while the polysilicon film 10 on the side surface of the mesa remains as a polysilicon side wall 11 to form the peripheral portion of the lower electrode. At this time, the lower electrode 9 is etched to 1,000 Å, so that the height of the mesa becomes 6,000 Å.

Figure 2E:
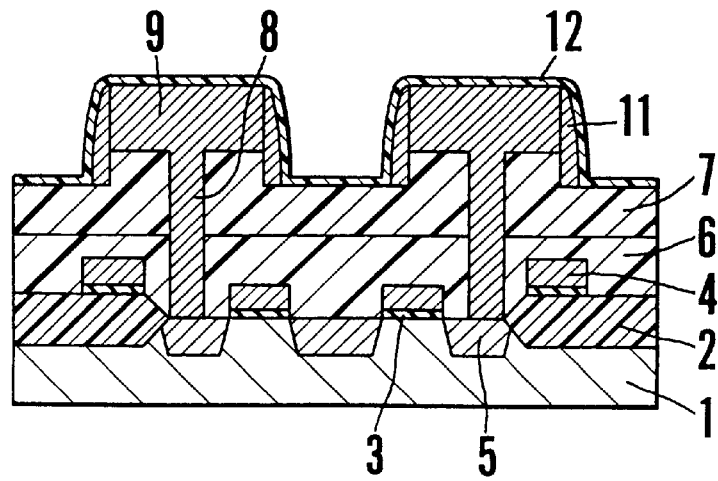
Figure 2F:
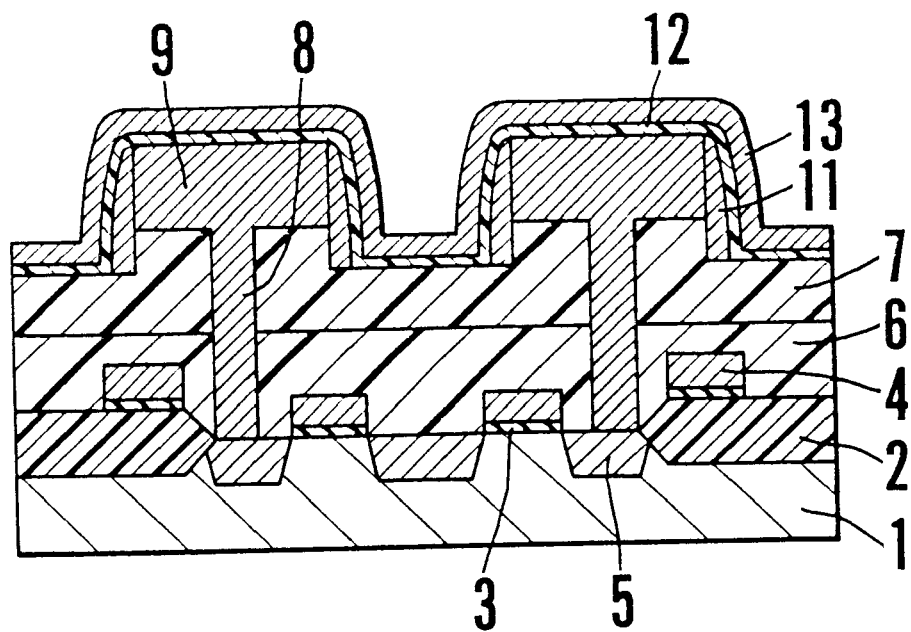
Figure 2G:
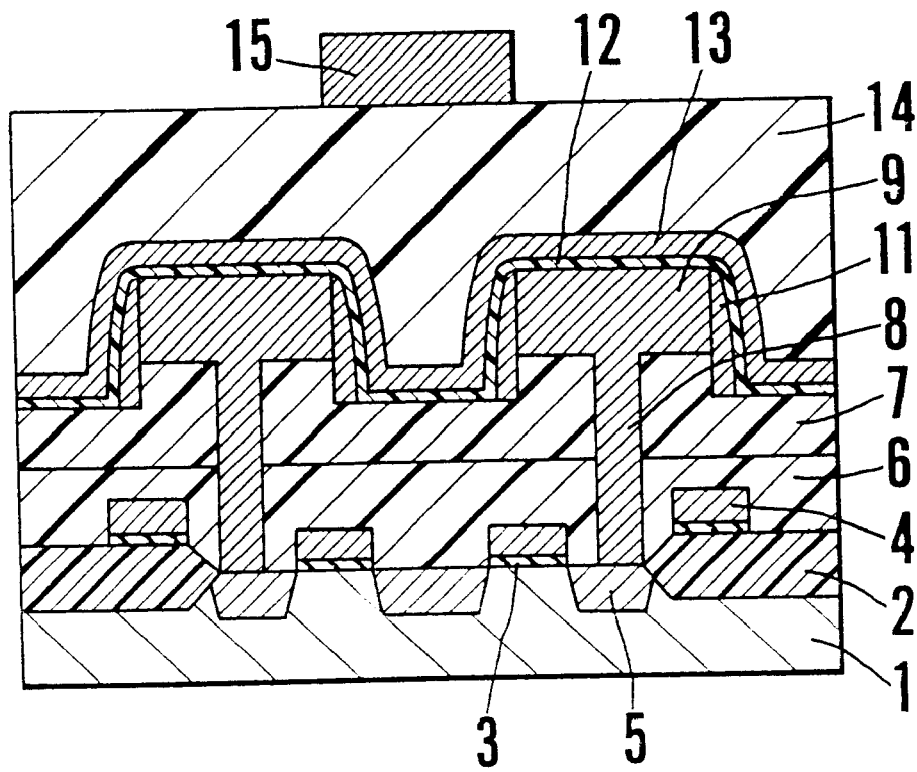

Thereafter, as shown in FIG. 2E, a capacitive insulating film 12 consisting of silicon nitride and silicon oxide is formed by a known method. As shown in FIG. 2F, a doped polysilicon film 13 is formed by a known method to form an upper electrode. Then, as shown in FIG. 2G, a third insulating interlayer 14 and an aluminum wiring layer 15 are formed by a known method. Although the subsequent processes are not illustrated, a passivation film is appropriately formed, and the resultant structure is encapsulated in a package, thereby completing a DRAM according to the first embodiment of the present invention.

In the capacitive element according to the first embodiment, the thickness of the lower electrode 9 is 3,000 Å. However, a large storage capacitance substantially corresponding to a surface area obtained by forming a 6,000-Å thick lower electrode can be obtained because of the polysilicon side wall 11. On the other hand, since the lower electrode 9 has a uniform thickness, and no projecting portion is formed, the capacitive insulating film or the upper electrode on the lower electrode 9 can be formed to have a uniform thickness. In addition, since the polysilicon side walls are formed on both sides of the lower electrode, structural stability can be ensured, and the characteristics can also be stabilized. In the manufacturing process, alignment in etching of the lower electrode 9 is unnecessary, and the manufacturing process is simplified.

Figure 3A:
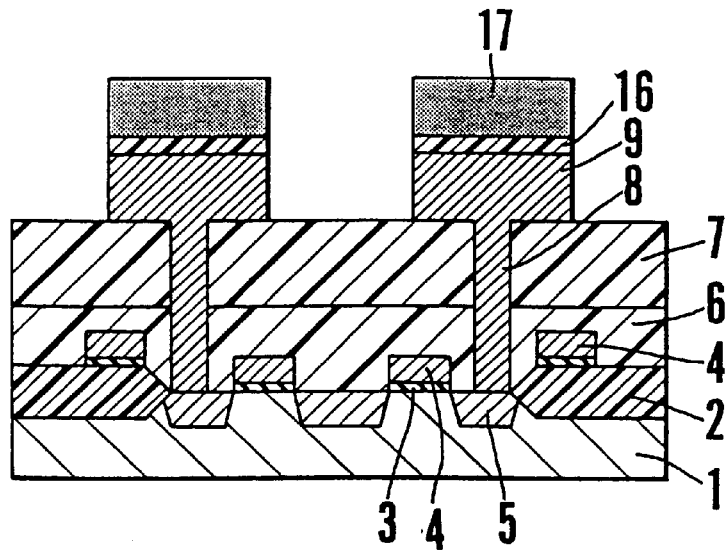
FIGS. 3A to 3H are sectional views showing steps in the manufacture of the second embodiment of the present invention.
Figure 3B:
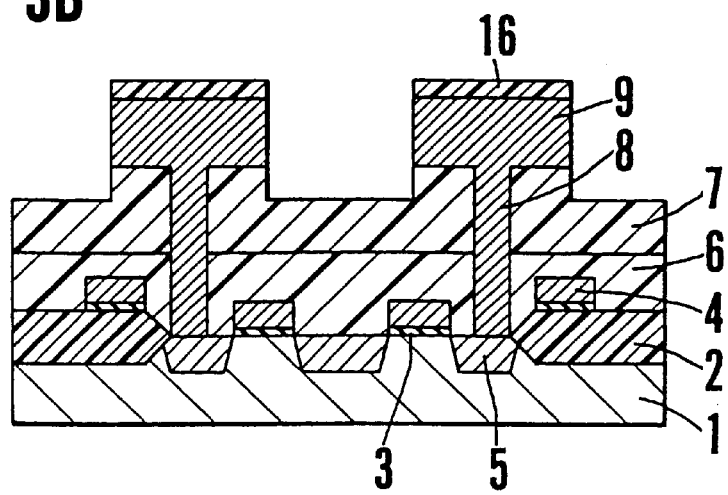
Figure 3C:
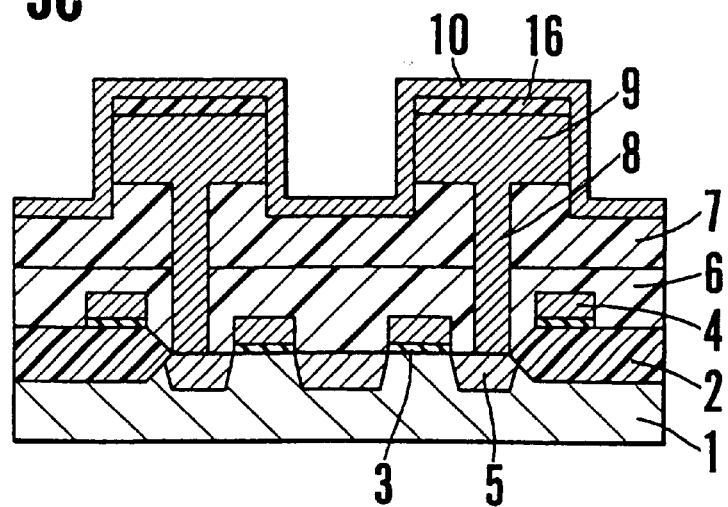
Figure 3D:
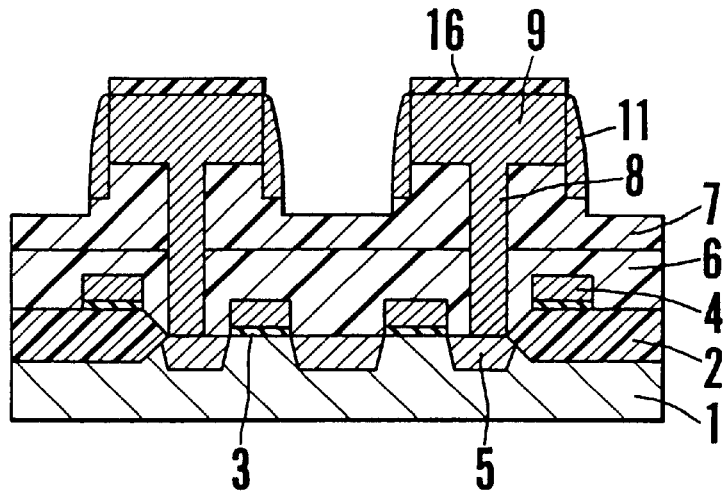

FIGS. 3A to 3H are sectional views showing steps of the second embodiment of the present invention. As shown in FIG. 3A, before a lower electrode 9 consisting of polysilicon is patterned in the step of the first embodiment shown in FIG. 2A, a silicon oxide film 16 having a thickness of 500 Å is deposited on the polysilicon film, and the lower electrode 9 is formed using a resist 17 as a mask. As shown in FIG. 3B, after a second insulating interlayer 7 is etched to 3,000 Å by using the resist as a mask, the resist is removed. Thereafter, as shown in FIG. 3C, a doped polysilicon film 10 is deposited on the entire surface, as in the first embodiment, and etched back, thereby forming a polysilicon side wall 11, as shown in FIG. 3D.

Figure 3E:
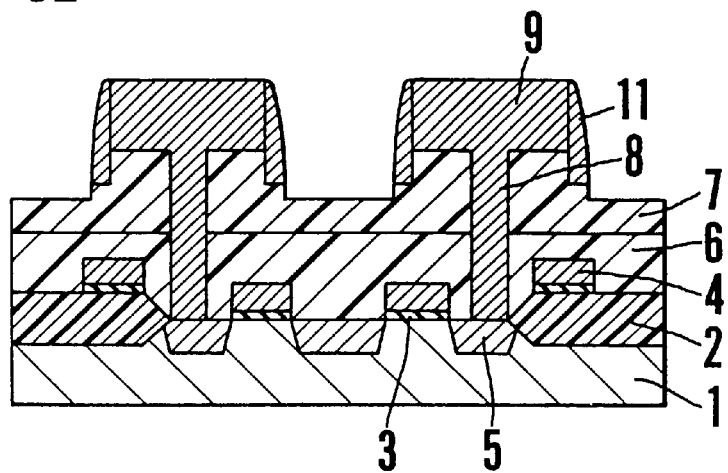
Figure 3F:
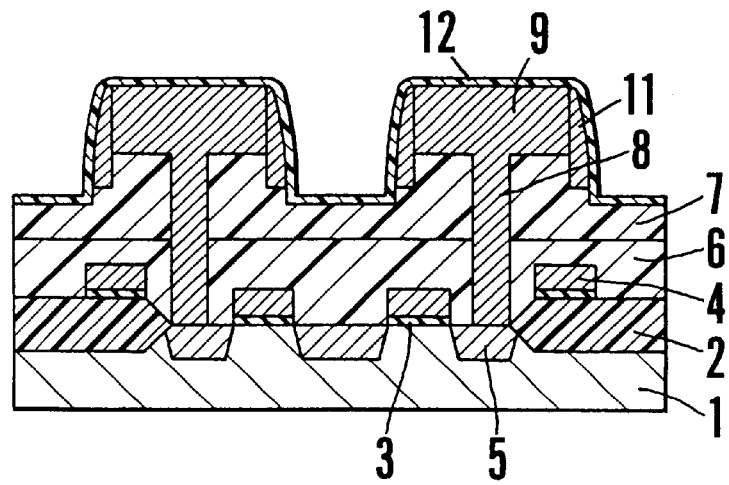
Figure 3G:
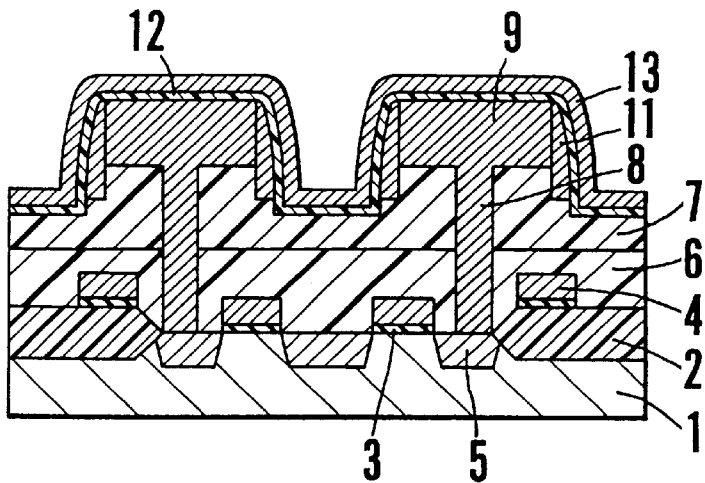
Figure 3H:
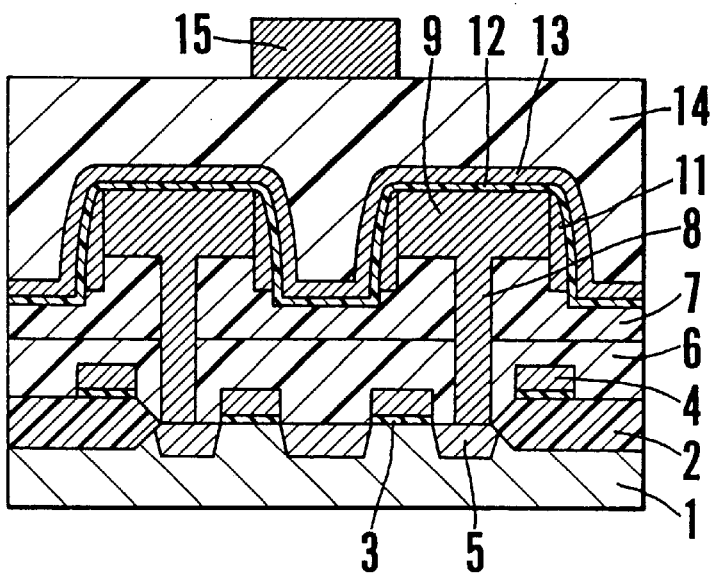

As shown in FIG. 3E, the silicon oxide film 16 is removed from the upper surface of the lower electrode 9 by using buffered hydrofluoric acid. As shown in FIG. 3F, a capacitive insulating film 12 is formed, as in the first embodiment. Furthermore, as shown in FIG. 3G, an upper electrode 13 is formed, and a third insulating interlayer 14 and an aluminum wiring layer 15 are formed, as shown in FIG. 3H, thereby completing the device.

In the second embodiment, in the etch-back process for forming the polysilicon side wall 11, the upper surface of the lower electrode 9 is prevented from being etched because the lower electrode 9 is covered with the silicon oxide film 16. For this reason, the height of the polysilicon side wall which contributes to the storage capacitance can be 7,000 Å, i.e., larger than that of the first embodiment by 1,000 Å, so that the storage capacitance can be made larger than that of the first embodiment. In this case, the surface of the insulating interlayer 7 is etched in the etching and removal process of the silicon oxide film 16. The height of a mesa including the lower electrode 9 becomes 7,500 Å, and the 500-Å thick lower side portion does not contribute to the capacitance. However, when the silicon oxide film 16 is made as thin as possible, no practical problem arises.

Figure 4:
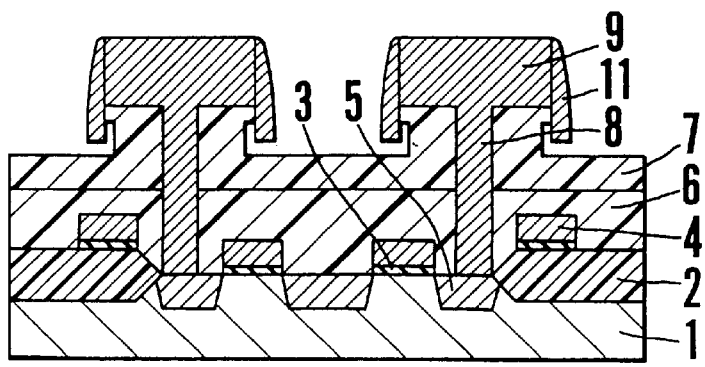
FIG. 4 is a sectional view showing a step in the manufacture of the third embodiment of the present invention.

FIG. 4 is a sectional view showing an intermediate step of the third embodiment of the present invention. In the third embodiment, after a side wall is formed, as in the first or second embodiment shown in FIGS. 2D or 3D, a second insulating interlayer 7 is etched to extend the etching region to the inside of the lower portion of a polysilicon side wall 11. With this process, the lower-side end face and part of the inner side surface of the polysilicon side wall 11 are exposed at the lower portion of the polysilicon side wall 11. Although not illustrated, the capacitive insulating film and the upper electrode are present inside of the lower portion of the polysilicon side wall 11. Therefore, the opposite area at this portion can be increased, resulting in a further increase in storage capacitance.

Figure 5A:
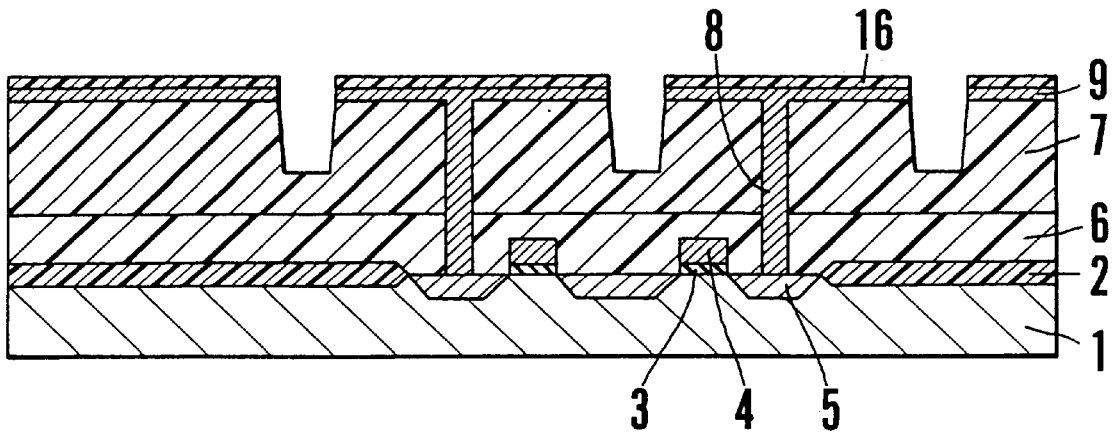
FIGS. 5A to 5F are sectional views showing steps in the manufacture of the fourth embodiment of the present invention.

FIGS. 5A to 5F are sectional views showing steps of the fourth embodiment of the present invention. In this embodiment, the entire surface of a semiconductor device is planarized. As shown in FIG. 5A, an element isolation region 2, a gate oxide film 3, a gate electrode 4, an n$^+$ region 5, first and second insulating interlayers 6 and 7, and capacitive contacts 8 are formed on a p-type silicon substrate 1. A polysilicon film 9 and a silicon oxide film 16 are formed and etched to form the lower electrode center 9. At this time, etching is performed such that the lower electrode 9 is left even at the peripheral portion where no capacitive element is formed. The thickness of the polysilicon film as the lower electrode 9 is 1,000 Å, the thickness of the silicon oxide film 16 on the lower electrode 9 is 500 Å, the thickness of the second insulating interlayer 7 is 8,000 Å, and the etching amount is 6,000 Å.

Figure 5B:
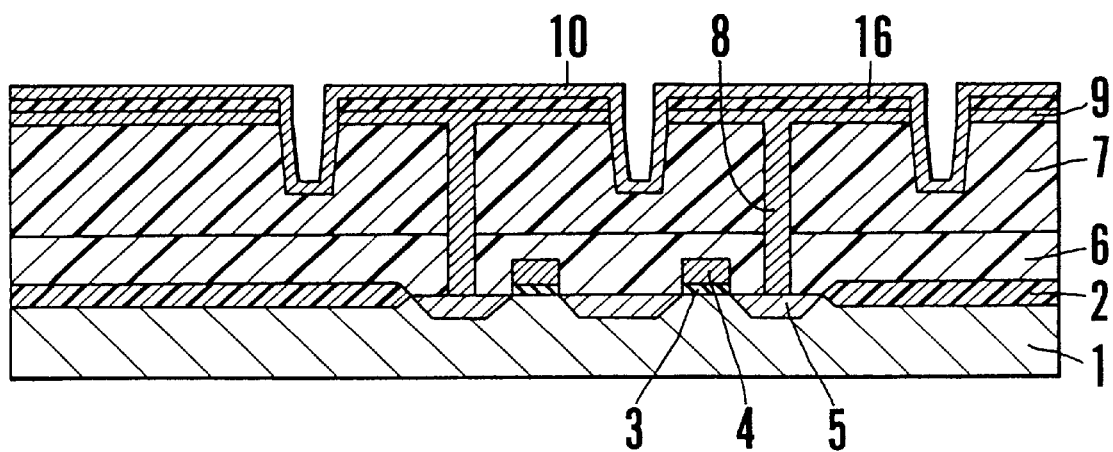
Figure 5C:
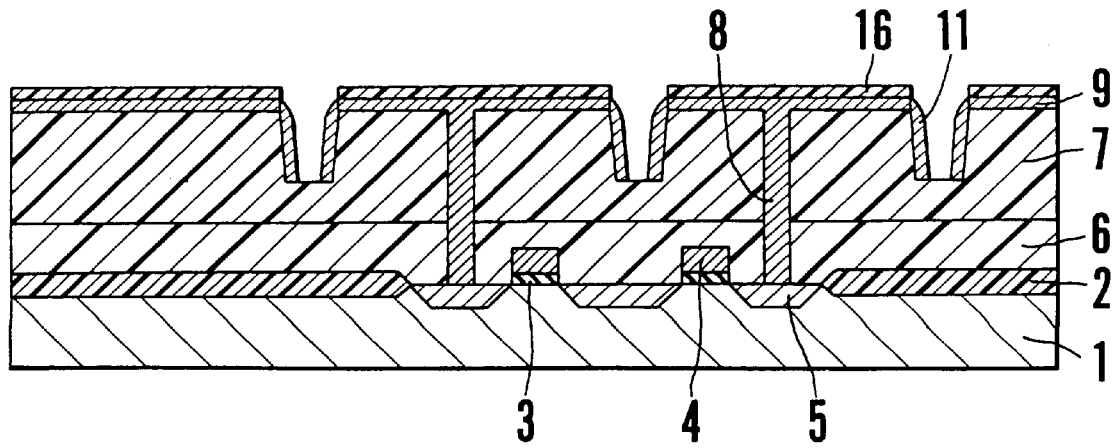
Figure 5D:
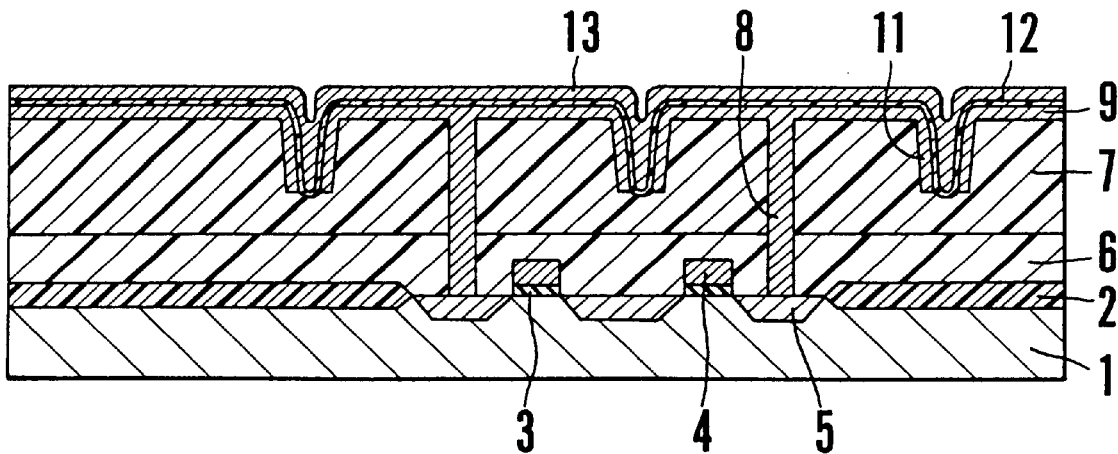
Figure 5E:
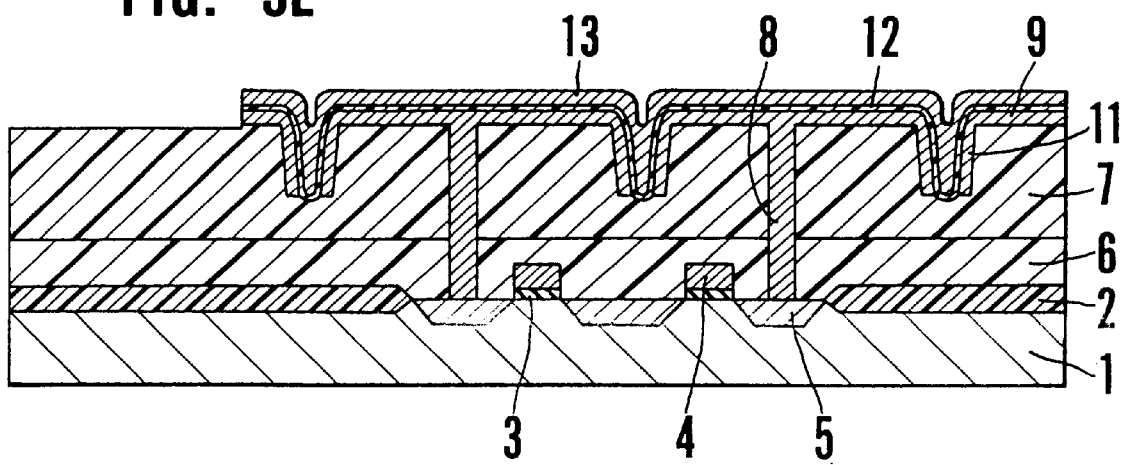
Figure 5F:
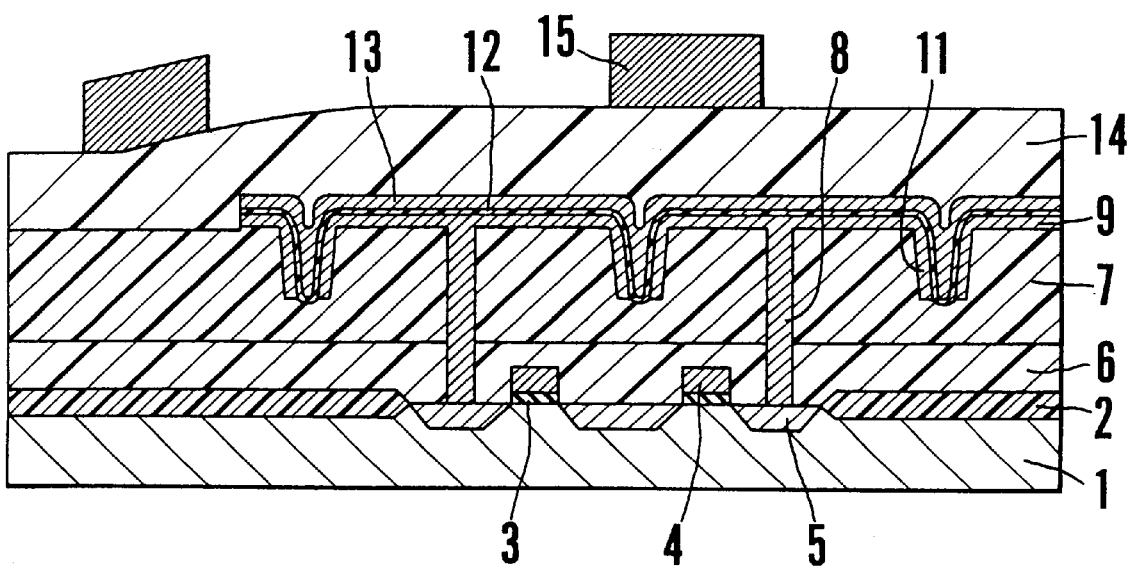

Subsequently, as shown in FIG. 5B, an impurity-doped polysilicon film 10 is deposited on the entire surface and etched back, as shown in FIG. 5C. As shown in FIG. 5D, the silicon oxide film 16 is removed from the upper surface of the lower electrode 9 by using buffered hydrofluoric acid, and a 1,500-Å thick polysilicon film serving as a capacitive insulating film 12 and an upper electrode 13 is formed by a known method. As shown in FIG. 5E, the polysilicon film 13, the capacitive insulating film 12, and the lower electrode 9 are patterned to form a capacitive element portion. At this time, the unnecessary lower electrode 9 portion left at the peripheral portion is simultaneously removed. Thereafter, as shown in FIG. 5F, a third insulating interlayer 14 and an aluminum wiring layer 15 are formed by a known method, thereby completing the device.

In the fourth embodiment, the charge storage amount can be increased. At the same time, the step between the capacitive element formation portion and the peripheral portion can be made as small as 2,500 Å which corresponds to the total thickness of the upper electrode 13 and the lower electrode 9 although the height of the side wall of the stacked structure of the lower electrode center 9 and the second insulating interlayer 7 is as large as 7,000 Å. Therefore, the entire surface of the semiconductor surface can be planarized, and the focus margin for the subsequent photolithography process can be increased.

Figure 6A:
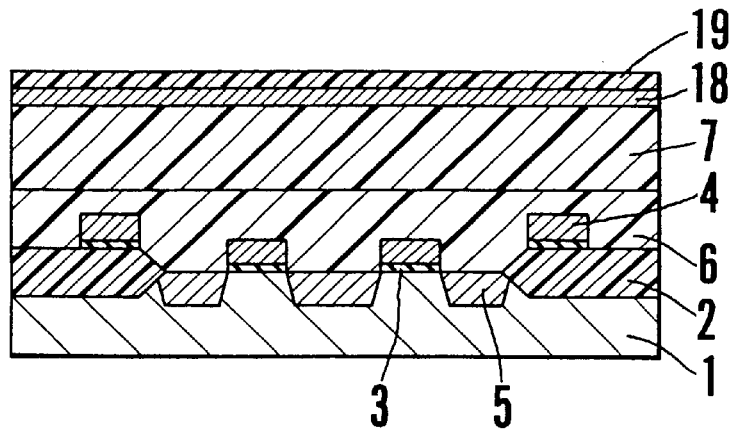
FIGS. 6A to 6E are sectional views showing steps in the manufacture of the fifth embodiment of the present invention.
Figure 6B:
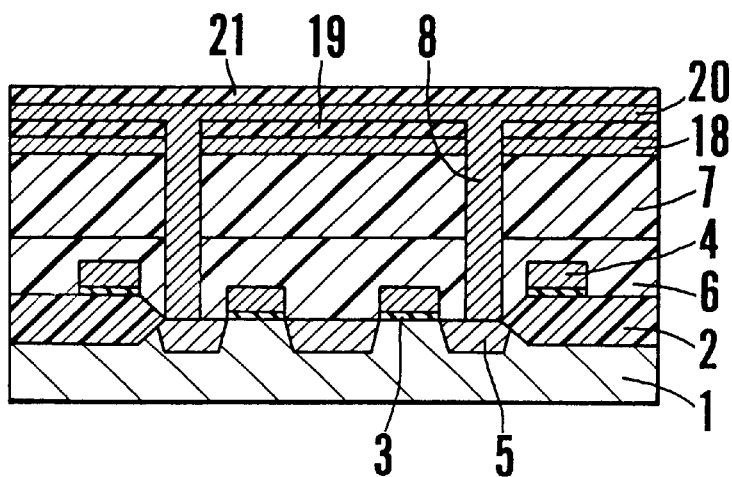
Figure 6C:
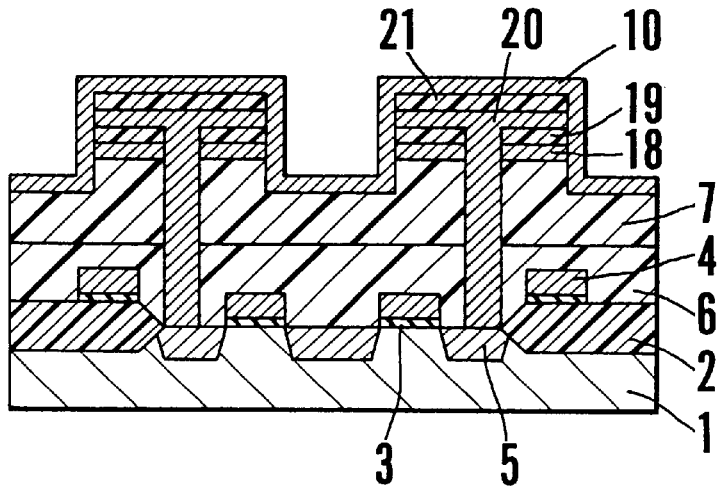

FIGS. 6A to 6E are sectional views showing steps of the fifth embodiment of the present invention. In this embodiment, the present invention is applied to a capacitive element having a fin type lower electrode. As shown in FIG. 6A, an element isolation region 2, a gate oxide film 3, a gate electrode 4, an n$^+$ region 5, and first and second insulating interlayers 6 and 7 are formed on a p-type silicon substrate 1. A polysilicon film 18 serving as a prospective fin, and a silicon oxide film 19 are sequentially formed on the resultant structure by a known method. As shown in FIG. 6B, capacitive contacts 8 are formed, and at the same time, a polysilicon film 20 serving as a fin is formed. Furthermore, a silicon oxide film 21 serving as a stopper is formed on the upper surface of the polysilicon film 20. Using a photoresist (not shown) as a mask, the polysilicon film 18, the silicon oxide film 19, the polysilicon film 20, and the silicon oxide film 21 are patterned, as shown in FIG. 6C. At this time, the second insulating interlayer 7 is simultaneously etched to about 3,000 Å. A polysilicon film 10 is formed on the resultant structure.

Figure 6D:
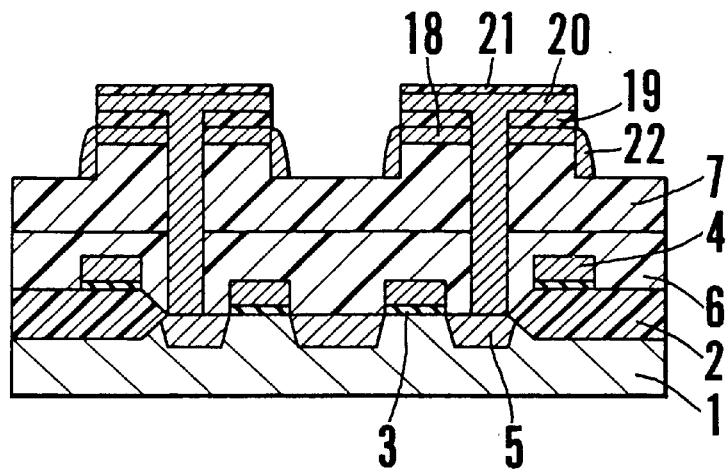
Figure 6E:
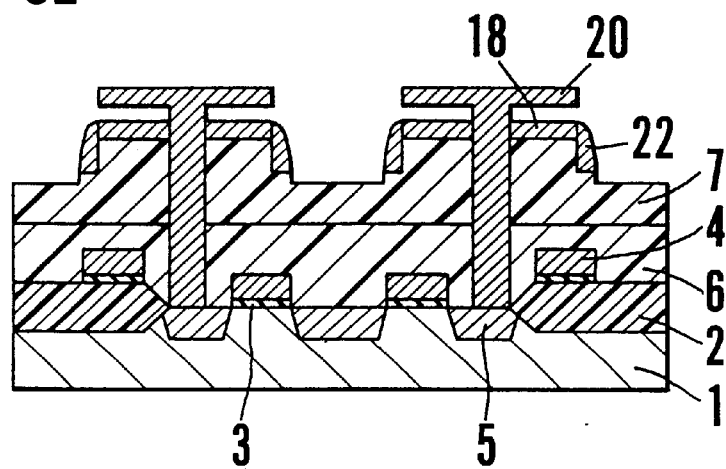

As shown in FIG. 6D, the polysilicon film 10 is etched back to form a polysilicon side wall 22 at the step portion between the side surface of the polysilicon film serving as the prospective fin and the insulating interlayer. As shown in FIG. 6E, the silicon oxide film 21 and the silicon oxide film 19 are removed using buffered hydrofluoric acid, thereby forming a fin type lower electrode having a side wall on its side surface. This lower electrode enables to increase the charge storage amount while maintaining structural stability by the side wall on the side surface, as in the first embodiment.

Figure 7:
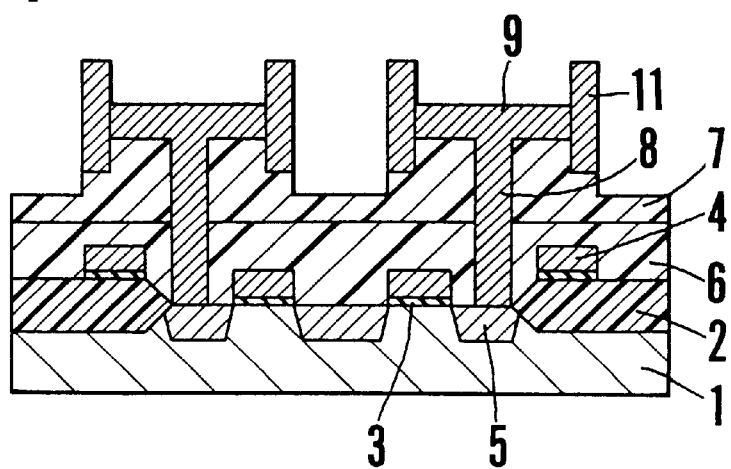
FIG. 7 is a sectional view showing a step in the manufacture of the sixth embodiment of the present invention.

FIG. 7 is a sectional view showing a step of the sixth embodiment of the present invention. In this embodiment, the present invention is applied to formation of a cylindrical type capacitive element lower electrode. More specifically, by forming a polysilicon side wall 11 around a lower electrode 9, the total side surface area of the lower electrode can be largely increased, resulting in a further increase in charge storage amount.

What is claimed is:

1. A semiconductor device having a mesa formed of a lower electrode and an interlayer insulating film having apertures therein formed on a semiconductor substrate, said lower electrode being formed on an upper surface of said interlayer insulating film and having an upper planar surface, said upper planar surface being an upper surface of said mesa, and a capacitor dielectric insulating film and an upper electrode are formed on the planar upper surface of said lower electrode thereby forming a capacitive element, wherein side walls comprising a conductive film are provided on the mesa such that said side walls are formed integrally on and connected to a peripheral side surface of said lower electrode and extend below a bottom surface of said lower electrode on a side of said interlayer insulating film toward a semiconductor substrate within a thickness of said interlayer insulating film and between said apertures, wherein upper ends of said side walls extend to the planar surface of said mesa.

2. A device according to claim 1, wherein a portion of said interlayer insulating film, which is not covered with said lower electrode, is etched such that a mesa is formed in which a portion covered with said lower electrode is higher than a portion which is not covered with said lower electrode, and said lower end portion of said side wall integrally formed on a side surface of said lower electrode extends into an etched region of said interlayer insulating film.

3. A device according to claim 2, wherein said insulating film is etched again to extend said etching region to an inside portion of said lower end portion of said side wall.

4. A device as recited in claim 2, wherein said upper electrode is formed to fill a said etched region between a said side wall of said lower electrode and said capacitor dielectric on a side of said mesa whereby a step height at said etched region is reduced.

5. A device as recited in claim 4, further including a further insulating layer over said upper electrode.

6. A device as recited in claim 5 wherein said further insulating layer is planarized.

7. A device as recited in claim 1, wherein said lower electrode is formed as a finned structure having vertically separated fins, said side wall of said lower electrode extending from a periphery of at least one fin of said finned structure.

* * * * *